(12) United States Patent
Das (10) Patent No.: US 8,415,554 B2
(45) Date of Patent: Apr. 9, 2013

(54) METAMATERIAL INTEGRATED SOLAR CONCENTRATOR

(75) Inventor: Sanjeet Das, Chantilly, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 13/232,663

(22) Filed: Sep. 14, 2011

(65) Prior Publication Data

US 2012/0067419 A1 Mar. 22, 2012

Related U.S. Application Data

(60) Provisional application No. 61/435,610, filed on Jan. 24, 2011.

(51) Int. Cl.
*H01L 31/00* (2006.01)
(52) U.S. Cl.
USPC .......................................................... 136/246
(58) Field of Classification Search ................. 136/244, 136/246, 252, 256, 259
See application file for complete search history.

(56) References Cited

U.S. PATENT DOCUMENTS

| | | | |
|---|---|---|---|
| 4,492,811 A | 1/1985 | Switzer | |
| 4,519,828 A | 5/1985 | Beall et al. | |
| 4,629,821 A | 12/1986 | Bronstein-Bonte et al. | |
| 4,661,649 A | 4/1987 | Reisfeld et al. | |
| 4,891,075 A | 1/1990 | Dakubu | |
| 4,968,631 A | 11/1990 | Dakubu | |
| 5,082,505 A | 1/1992 | Cota et al. | |
| 5,095,099 A | 3/1992 | Parkinson et al. | |
| 5,468,694 A | 11/1995 | Taguchi et al. | |
| 6,476,312 B1 * | 11/2002 | Barnham | 136/247 |
| 2003/0081895 A1 * | 5/2003 | Roy et al. | 385/31 |
| 2007/0280587 A1 * | 12/2007 | Makita | 385/14 |
| 2008/0149165 A1 | 6/2008 | Hoeks et al. | |
| 2009/0107541 A1 * | 4/2009 | Linke et al. | 136/246 |
| 2009/0205701 A1 | 8/2009 | Govaerts et al. | |
| 2010/0043880 A1 | 2/2010 | Bhaumik et al. | |
| 2010/0200044 A1 * | 8/2010 | Zaban et al. | 136/246 |

OTHER PUBLICATIONS

G. Agnostinelli and E.J. Haverkamp, "Angular Dependency of External Quantum Efficiency on High Efficiency Solar Cells", [online], retrieved on Aug. 1, 2011, retrieved using Internet <http://www.rerasystems.com/pdf/ang.pdf>.

(Continued)

*Primary Examiner* — Alexander Kollias
(74) *Attorney, Agent, or Firm* — Amy L. Ressing; Sally A. Ferrett (57) ABSTRACT

An optical device including a metamaterial layer having a negative index of refraction for at least one wavelength in the visible range of 400-700 nm, a photovoltaic cell, and an optical waveguide arranged between the metamaterial layer and the photovoltaic cell. The optical waveguide has a first face and second face arranged opposite the first face, the first face having a larger area than the second face, the metamaterial layer positioned at the first face of the optical waveguide and the photovoltaic cell positioned at the second face of the optical waveguide. The optical device can be a solar collector. The optical waveguide can have a trapezoidal cross section, with the side faces of the waveguide having an angle of tilt sufficient to ensure total internal reflection for all incidence angles within the metamaterial's acceptance cone.

10 Claims, 6 Drawing Sheets

OTHER PUBLICATIONS

S.P. Burgos, R. deWaele, A. Polman, and H.A. Atwater, "A single-layer wide-angle negative-index metamaterial at visible frequencies", Nature Materials, vol. 9, pp. 407-412, published online on Apr. 18, 2010.

R. deWaele, S.P. Burgos, H.A. Atwater, and A. Polman, "Negative refractive index in coaxial plasmon waveguides", Optics Express, vol. 18, No. 12, pp. 12770-12778, May 28, 2010.

J.H. Karp et al., "Planar micro-optic solar concentrator", Optics Express, vol. 18, No. 2, pp. 1124-1133, Jan. 8, 2010.

P. Benítez, J.C. Miñano, P. Zamora, R. Mohedano, A. Cvetkovic, M. Buljan, J. Chaves, and M. Hernández, "High performance Fresnel-based photovoltaic concentrator," Opt. Express, vol. 18, Issue S1, pp. A25-A40 (Apr. 26, 2010).

P. Benítez, and J. C. Miñano, "Concentrator Optics for the next generation photovoltaics", Chap. 13 of A. Marti & A. Luque, Next Generation Photovoltaics: High Efficiency through Full Spectrum Utilization, (Taylor & Francis, CRC Press, London, 2004), 41 pages.

M.J. Currie, et al., "High-Efficiency Organic Solar Concentrators for Photovoltaics", Science, vol. 321, pp. 226-228, (Jul. 2008).

P.A. Davies, "Design of single-surface spherical lenses as secondary concentrators for photovoltaic cells", Pure Applied Optics, vol. 2, p. 315-324, 1993.

S. Linden, C. Enkrich, M. Wegener, J. Zhou, T. Koschny, C.M. Soukoulis, Science, vol. 306, p. 1351-1353, (2004).

J. Yang, M. Huang, C. Yang, Z. Ziao, and J. Peng, "Metamaterial electromagnetic concentrators with arbitrary geometries", Optics Express, vol. 17, No. 22, pp. 19656-19661, Oct. 15, 2009.

N. Yamada, T. Ijiro, "Design of wavelength selective concentrator for micro PV-TPV systems using evolutionary algorithm", Optics Express, vol. 19., No. 14, pp. 13140-13149, Jun. 22, 2011.

C.-M. Wang, H.-I. Huang, J.W. Pan. H.-Z. Kuo, H.-F. Hong, H.-Y. Shin, J.-Y. Chang, "Single stage transmission type broadband solar concentrator", Optics Express, vol. 18, No. S2, pp. A118-A125, May 19, 2010.

B.C. Rowan, L.R. Wilson, and B.S. Richards, "Advanced Material Concepts for Luminescent Solar Collectors", IEEE Journal of Selected Topics in Quantum Electronics, vol. 14, No. 5, pp. 1312-1322, Sep. 2008.

J. B. Pendry, A.J. Holden, W.J. Stewart, and I. Youngs, "Extremely low frequency plasmons in metallic mesostructures", Phys. Rev. Lett., vol. 76, p. 4773-4776, (1996).

D. Smith, W.J. Padilla, D.C. View, S.C. Nemat-Nasser and S. Schultz, "Composite Medium with simultaneously negative permeability and permittivity", Phys. Rev. Lett., vol. 84, p. 4184-4187, (2000).

J. B. Pendry, A.J. Holden, D.J. Robbins, and W.J. Stewart, "Magnetism from conductors and enhanced nonlinear phenomena", IEEE Trans. Microw. Theory Techniques, vol. 47, p. 2075-2084, (1999).

N. Okada, S. Yamanaka, H. Kawamura, and H. Ohno, "Energy Loss of Photovoltaic system caused by irradiance and incident angle," in Proc. 3rd IEEE Photovoltaic Energy Conversion. World. Conf., 2003, pp. 2062-2065.

What is Concentrator Photovoltaic System?, [online], [retrieved on Sep. 15, 2011], retrieved using Internet <http://www.isuzuglass.com/development/cpv.html>.

* cited by examiner

METAMATERIAL INTEGRATED SOLAR CONCENTRATOR

CROSS-REFERENCE TO RELATED APPLICATIONS

This Application is a non-provisional under 35 USC 119(d) of, and claims the benefit of, U.S. Provisional Application 61/435,610 filed on Jan. 24, 2011, the entire disclosure of which is incorporated herein.

BACKGROUND

1. Technical Field

The invention is in the field of solar collection, and more particularly, in the field of photovoltaic solar power.

2. Related Technology

Photovoltaic cells have typically been oriented so they point directly at the sun, to maximize the power generation efficiency. G. Agnostelli and E. J. Haverkamp, "Angular Dependency of External Quantum Efficiency on High Efficiency Solar Cells", <http://www.rerasystems.com/pdf/ang.pdf>, describes the rapid decrease in power generation efficiency as the incidence angle increases.

Luminescent solar collectors have been proposed that will operate on a principal of an luminescent material absorbing incident sunlight and subsequently re-emitting light at a different wavelength, as described in B. C. Rowan, L. R. Wilson, and B. S. Richards, "Advanced Material Concepts for Luminescent Solar Collectors", IEEE Journal of Selected Topics in Quantum Electronics, Vol. 14, No. 5, September 2008, pp. 1312-1322.

Concentrator photovoltaic systems are photovoltaic systems that use optical concentrators to increase the light that reaches a photovoltaic cell. One example is shown in P. A. Davies, "Design of single-surface spherical lenses as secondary concentrators for photovoltaic cells", Pure Applied Optics, Vol. 2, p. 315-324, 1993. Other examples are shown in A. Luque, S. Hegedus, "Handbook of Photovoltaic Science and Engineering", section 10.4 (2011). Light-focusing lenses for concentrators are manufactured by Isuzu Glass, as described at <http://www.isuzuglass.com/development/cpv.html>.

Negative index of refraction metamaterials have been demonstrated for use in the microwave regime in several recent papers, including J. B. Pendry, et al., Phys. Rev. Lett., Vol. 76 p. 4773 (1996); J. B. Pendry, et al., IEEE Trans. Microw. Theory Techniques, Vol. 47, p. 2075 (1999); and D. Smith, et al., Phys. Rev. Lett., Vol. 84, p. 4184 (2000); as well as in the 100 terahertz range in S. Linden, et. al., Science, Vol. 306, p. 1351 (2004).

Negative index of refraction materials have also been demonstrated for visible wavelengths, as described in S. P. Burgos, R. deWaele, A. Polman, and H. A. Atwater, "A single-layer wide-angle negative-index metamaterial at visible frequencies", Nature Materials, Vol. 9, pp. 407-412, published online on Apr. 18, 2010. A theoretical basis for the materials is described in R. deWaele, S. P. Burgos, H. A. Atwater, and A. Polman, "Negative refractive index in coaxial plasmon waveguides", Optics Express, Vol. 18, No. 12, pp. 12770-12778, 28 May 2010.

SUMMARY

An optical device including a metamaterial layer with a negative index of refraction for at least one wavelength in the visible range of 400-700 nm, a photovoltaic cell, and an optical waveguide arranged between the metamaterial layer and the photovoltaic cell. The optical waveguide has a first face and second face opposite the first face, the first face having a larger area than the second face, the metamaterial layer positioned at the first face of the optical waveguide and the photovoltaic cell positioned at the second face of the optical waveguide.

The cross section of the optical waveguide taken at a plane perpendicular to both the first face and the second face is trapezoidal. The waveguide has a plurality of planar sides, with each of the planar sides having a trapezoidal shape. In one embodiment, the optical waveguide has exactly four planar trapezoidal sides.

The metamaterial layer can have a negative index of refraction for all wavelengths of incident radiation between 400 nm and 700 nm.

Each of the side faces can have a tilt angle $\theta_T$ defined by $\theta_T > \theta_C - \theta_{MO}$, wherein $\theta_C$ is the critical angle of the optical waveguide with a surrounding external medium and $\theta_{MO}$ is an angle of refraction between the metamaterial layer and the optical waveguide.

Each of the side faces can have a tilt angle $\theta_T$ that is less than 90 degrees and greater than $$\sin^{-1}\left(\frac{n_A}{n_O}\right) - \sin^{-1}\left(\frac{n_A \sin\theta_i}{n_O}\right),$$

wherein $n_A$ is the index of refraction of a surrounding environment, $n_O$ is the index of refraction of the optical waveguide, and $\theta_i$ is the angle of incidence of incident radiation on the metamaterial layer.

The metamaterial layer can include an array of coaxial waveguides having a metal core surrounded by a dielectric cylinder and clad with a metal outer layer, with metal core and the metal outer layers being silver and the dielectric cylinder being silicon or gallium phosphide.

The optical waveguide has an angle of tilt $\theta_T$ less than 90 degrees and greater than the inverse tangent of h/x, wherein h is the height of the waveguide and x is found by solving parametric ray equations within the metamaterial and optical waveguide with a boundary condition that the radiation transmitted from the metamaterial to a side face of the optical waveguide strikes the second face of the optical waveguide.

An optical device comprises a metamaterial layer having a negative index of refraction, a photovoltaic cell, and an optical waveguide having a trapezoidal cross section, a first face and second face arranged opposite the first face, the optical waveguide having four trapezoidal side faces joining the first face and the second face, the first face having a larger area than the second face, the optical waveguide arranged between the metamaterial layer and the photovoltaic cell with the metamaterial layer positioned at the first face of the optical waveguide and the photovoltaic cell positioned at the second face of the optical waveguide. The optical waveguide has a tilt angle $\theta_T$ of less than 90 degrees, and greater than $$\sin^{-1}\left(\frac{n_A}{n_O}\right) - \sin^{-1}\left(\frac{n_A \sin\theta_i}{n_O}\right),$$

determined for angles of incidence $\theta_i$ within the acceptance cone of the metamaterial, wherein $\theta_C$ is the critical angle of the optical waveguide with a surrounding external medium and $\theta_{MO}$ is an angle of refraction between the metamaterial layer and the optical waveguide, $n_A$ is the index of refraction of an external environment, surrounding environment, $n_O$ is the index of refraction of the optical waveguide, and $\theta_i$ is the angle of incidence of incident radiation on the metamaterial layer.

DETAILED DESCRIPTION OF THE INVENTION

Figure 1A:
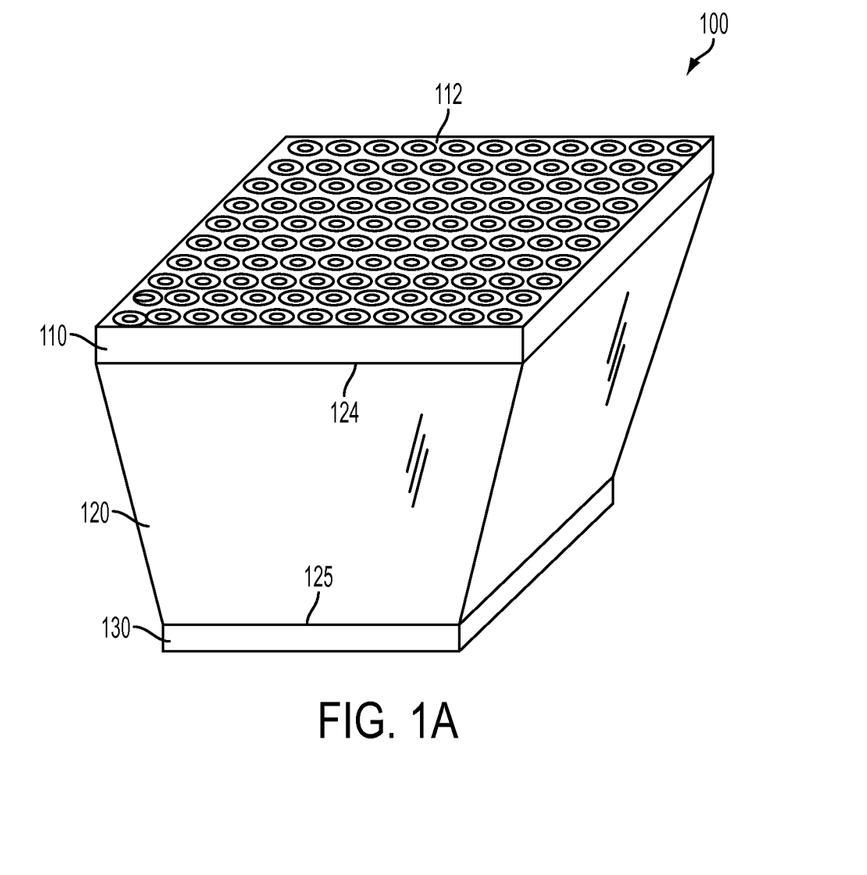
FIGS. 1A and 1B illustrate a metamaterial integrated solar collector in accordance with an embodiment of the invention.
Figure 1B:
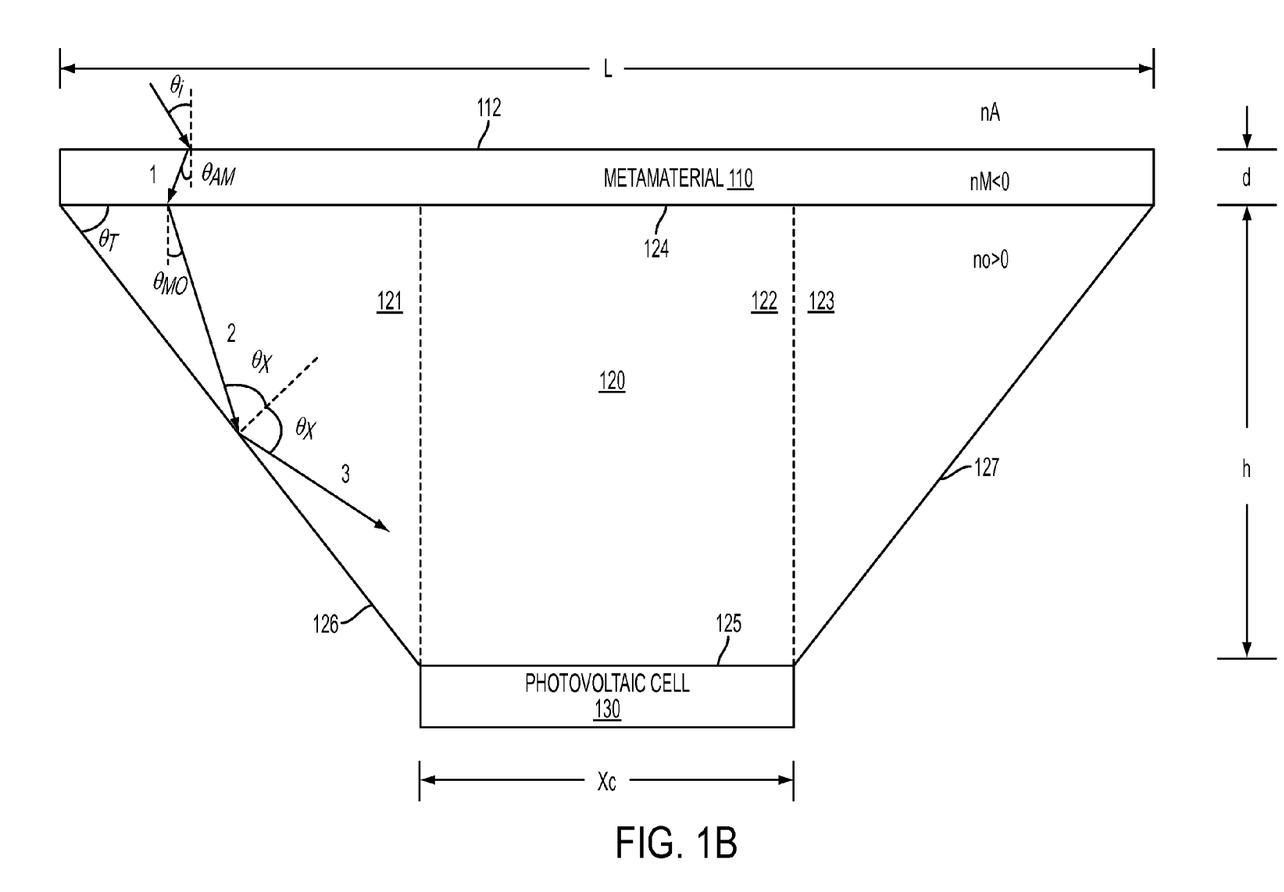

FIGS. 1A and 1B illustrate an optical collecting device 100 according to an embodiment of the invention.

The photovoltaic solar collector 100 has a layer of material 110 that has a negative index of refraction in the visible wavelengths of 400 nm to 700 nm Sunlight is incident on the exposed face 112 of the negative index material layer 110. The opposite face of the negative index material layer is positioned against an optical waveguide 120, so the radiation is transmitted through the negative index of refraction material layer 110 to optical waveguide. The optical waveguide 120 has a trapezoidal cross section, with the upper face 124 of the optical waveguide being wider than the opposite face 25 of the trapezoidal optical waveguide. A photovoltaic cell 130 is positioned at the opposite face 125 of the optical waveguide to receive the optical energy transmitted through the waveguide 120.

The metamaterial layer 110 has a negative index of refraction index at least one wavelengths between 400 to 700 nm, and preferably, has a negative index of refraction at all wavelengths between 400 and 700 nm. This visible wavelength band contains the most spectral irradiance and photon flux of solar radiation. The metamaterial layer preferably transmits most of the incident optical energy in the visible wavelengths, and absorbs little of this radiation. The metamaterial layer further preferably has low thermal loss.

It is preferred that the metamaterial layer have an index of refraction close to negative one, to minimize Fresnel reflections. Materials with an index of refraction that is more negative than negative one can also be suitable, however, more Fresnel reflection loss is expected to occur.

Figure 2A:
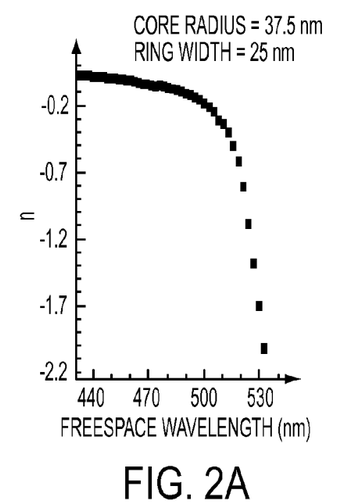
FIG. 2 shows the index of refraction for three different metamaterial in the visible wavelengths.
Figure 2B:
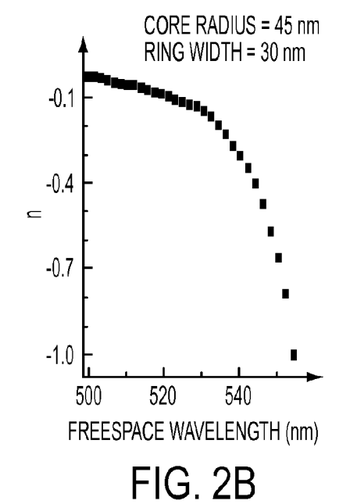
Figure 2C:
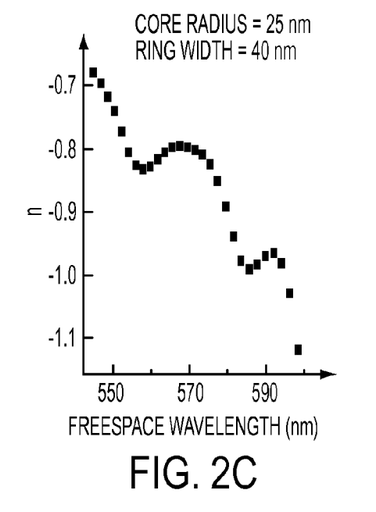

Recently developed metamaterials for visible wavelengths that can be suitable for the metamaterial layer 110 are described in S. P. Burgos, R. de Waele, A. Polman, and H. A. Atwater, "A single-layer negative-index metamaterial at visible frequencies", Nature Materials, Vol. 9, pp. 407-412, published online on Apr. 18, 2010, and in R. deWaele, S. P. Burgos, H. A. Atwater, and A. Polman, "Negative refractive index in coaxial plasmon waveguides", Optics Express, Vol. 18, No. 12, pp. 12770-12778, 28 May 2010, each of which are incorporated by reference in their entireties. The materials include a hexagonally close-packed array of coaxial waveguides having a metal core surrounded by a dielectric cylinder and clad with a metal outer layer. Computer simulations show that three different variants of the metal-on-metal coaxial materials can provide a negative index of refraction in the 400-700 nm range: (a) core radius of 37.5 nm, dielectric ring width of 25 nm, wavelength range of 430-530 nm; (b) core radius of 45 nm, dielectric ring width of 30 nm, wavelength range of 500-550 nm; and (c) core radius of 25 nm, dielectric ring width of 40 nm, and wavelength range of 550-600 nm FIGS. 2A, 2B, and 2C are plots of the index of refraction of these metal-on-metal coaxial materials determined through computer simulations. It is noted that although both Ag/Si/As and Ag/GaP/Ag plasmonic metamaterials can be used in the metamaterial layer, Ag/Si/Ag is simpler to manufacture.

The optical waveguide 120 is formed of glass, plastic, or other optical material having a high transmission in the visible wavelength range, and a high positive index of refraction. One suitable optical waveguide material is a dense flint glass such as SF11, commercially available from Schott North America, headquartered in Elmsford, N.Y. SF11 has a which has a refractive index n of about 1.78 and internal transmittance of almost 1.0 in the visible range. Other optical waveguide materials include other high index glasses and plastics, such as BK-7, BAK-2, and other high transmission glasses.

A photovoltaic cell 130 is positioned at the lower face of the optical waveguide 120. The photovoltaic cell 130 can be any type of photovoltaic cell, including but not limited to cells formed of monocrystalline silicon, polycrystalline silicon, ribbon silicon, cadmium telluride (CdTe), copper indium gallium selenide (CIGS), and amorphous silicon (A-Si). The photovoltaic cell can have square shape with a length for each side of $x_C$, which is typically between a few millimeters and about 10 centimeters, although other shapes can also be used.

FIG. 1B illustrates a cross sectional view of the solar collector of FIG. 1A, taken through the center of the device.

The lower face 125 of the waveguide 120 has a length that preferably is equal to the side dimension $x_C$ of the photovoltaic cell 130. The metamaterial 110 has a thickness d, and a length L equal to the length of the upper face 124 of the trapezoidal waveguide 120.

The optical waveguide 122 can be sized so the maximum amount of light entering the waveguide reaches the photovoltaic cell. The tilt angle of the side faces of the optical waveguide can be selected to ensure total internal reflection of incident radiation at the side faces of the trapezoidal waveguide. For total internal reflection, the sides are angled so incident radiation from the metamaterial layer 110 will strike the side faces of the waveguide at an angle larger than the waveguide's critical angle $\theta_C$.

Figure 3:
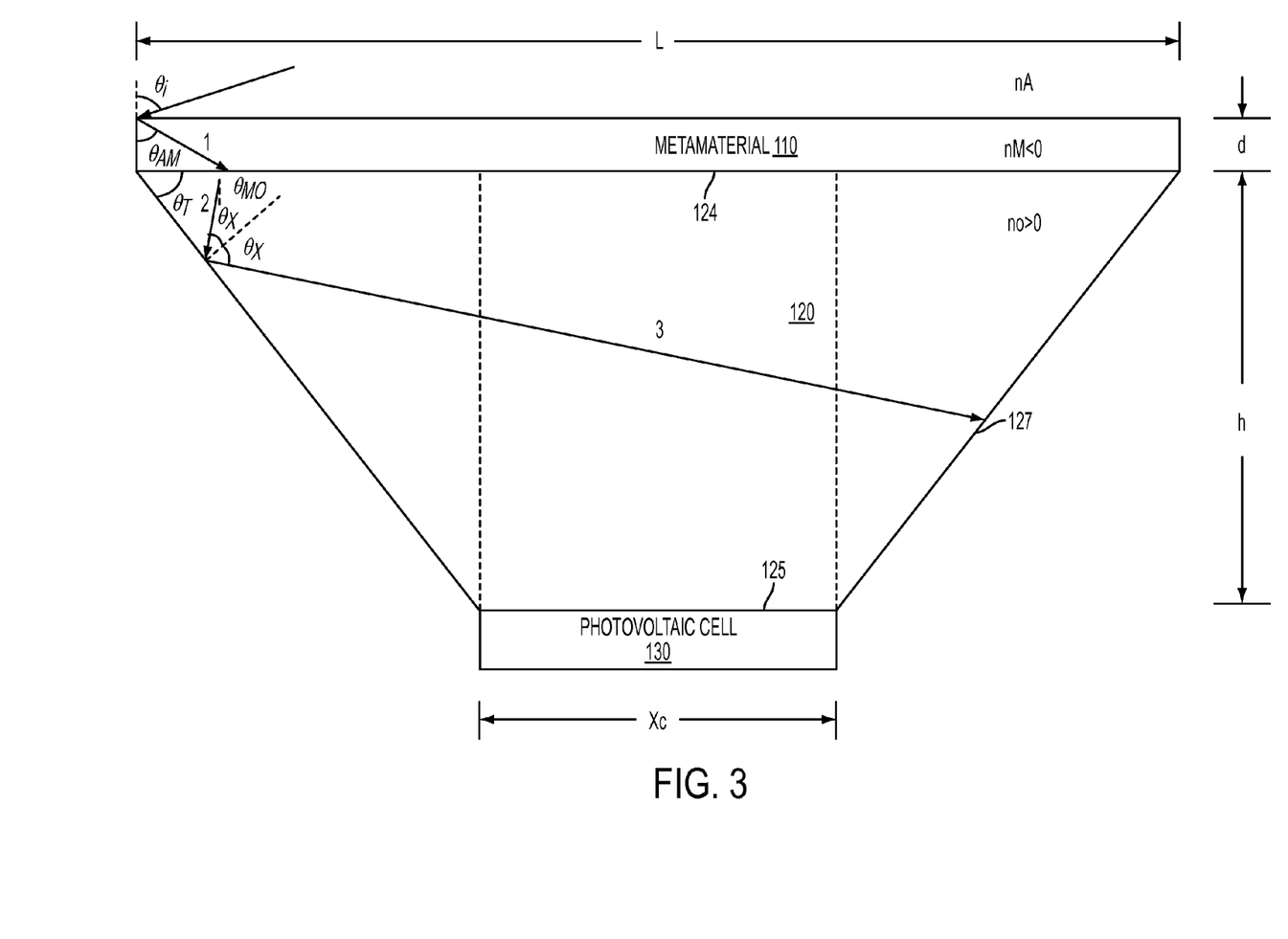
FIG. 3 and FIG. 4A are cross sectional views of metamaterial solar collectors with different optical waveguide tilt angles.

The trapezoidal cross section can be considered to be formed of three sections—a center rectangular section 122 of height h, and two triangular sections 121 and 123, each having the same height h. The following angles are defined for a ray 310 incident on a metamaterial layer 110 with a trapezoidal optical waveguide 120:

$\theta_i$=angle of incidence of the radiation;
$\theta_{AM}$=angle of refraction from air to metamaterial;
$\theta_{MO}$=angle of refraction from metamaterial to optic;
$\theta_X$=angle of reflection, the angle the rays in the optical waveguide make with a line normal to the side face of the waveguide;
$\theta_C$=critical angle for the waveguide optical material $\theta_T$=angle of tilt of triangle/rhombus, the included angle between the wider upper face of the waveguide and the side face;

$n_A$=refractive index of the external environment, approximately equal to +1 for air or vacuum;

$n_M$=refractive index of metamaterial; and $n_O$=refractive index of the optical waveguide.

Considering the triangular section 121 of the waveguide in FIG. 2, by Snell's law, the angle of refraction from air to metamaterial $\theta_{AM}$ will be $$\theta_{AM} = \sin^{-1}\left(\frac{n_A \sin\theta_i}{n_O}\right);$$

the angle of refraction from metamaterial to waveguide will be:

$$\theta_{MO} = \sin^{-1}\left(\frac{n_M \sin\theta_{AM}}{n_O}\right);$$

and the critical angle for the optical waveguide is $$\theta_C = \sin^{-1}(n_A/n_O).$$

To maximize the amount of radiation entering the waveguide from the metamaterial that reaches the photovoltaic cell 130, the concept of total internal reflection is used to find the minimum value of the angle of tilt $\theta_T$ of the side faces of the waveguide. The angle of reflection $\theta_X$ must be larger than the critical angle $\theta_C$ of the optical waveguide to prevent loss through the waveguide/air interface.

For the triangle defined by ray 2, the waveguide side face 126, and the waveguide upper face 124, the sum of the included angles must equal 180 degrees, so $\theta_T + (90° + \theta_{MO}) + (90° - \theta_X) = 180°$, which can be simplified to $\theta_T = \theta_X - \theta_{MO}$.

Since the angle of reflection $\theta_X$ must be larger than the critical angle $\theta_C$ for total internal reflection at the side face, the angle of tilt can be found as $\theta_T > \theta_C - \theta_{MO}$ or $\theta_T > 90° - \theta_{CC} - \theta_{MO}$ where $\theta_{CC}$ is the complement of $\theta_C$. The value of the angle of tilt $\theta_T$ can also be written in terms of the refractive indices as $$\theta_T > \sin^{-1}\left(\frac{n_A}{n_O}\right) - \sin^{-1}\left(\frac{n_M \sin\theta_{AM}}{n_O}\right).$$

and by substituting for the value of $\sin\theta_{AM}$, $$\theta_T > \sin^{-1}\left(\frac{n_A}{n_O}\right) - \sin^{-1}\left(\frac{n_A \sin\theta_i}{n_O}\right).$$

Thus, for a given photovoltaic cell size ($x_C$) and waveguide thickness h, the minimum waveguide angle of tilt angle can be determined for solar energy striking the surface of the metamaterial layer 110 at any incidence angle $\theta_i$. Thus, the waveguide's minimum angle of tilt for total internal reflection at the first trapezoidal face is found by considering that the internal rays must strike the side face of the optical waveguide with an angle of incidence greater than the critical angle. Note that at a zero incidence angle, the tilt angle equation can be simplified to $$\theta_T > \sin^{-1}\left(\frac{n_A}{n_O}\right).$$

Next, consider the entire trapezoidal cross section of the optical waveguide 120. To maximize the radiation that reaches the photovoltaic cell, the rays that are incident on the first trapezoidal face must be reflected toward the photovoltaic cell so that all radiation reaches the photovoltaic cell, rather than reaching the opposite trapezoidal face, where it might be transmitted out of the waveguide's opposite trapezoidal face. FIG. 3 shows a trapezoidal waveguide in which radiation is reflected by the trapezoidal side face 126 toward the opposite face 127 of the trapezoidal waveguide. Compare the metamaterial integrated solar collector of FIG. 4A, which has a trapezoidal waveguide with a larger tilt angle, in which the incident radiation is reflected toward the photovoltaic cell 130. Thus, for incident radiation having an incidence angle within the acceptance cone of the metamaterial, and for given values of the index of refraction of the metamaterial and the waveguide, there is a minimum tilt angle in which all incident radiation will reach the photovoltaic cell surface.

Figure 4A:
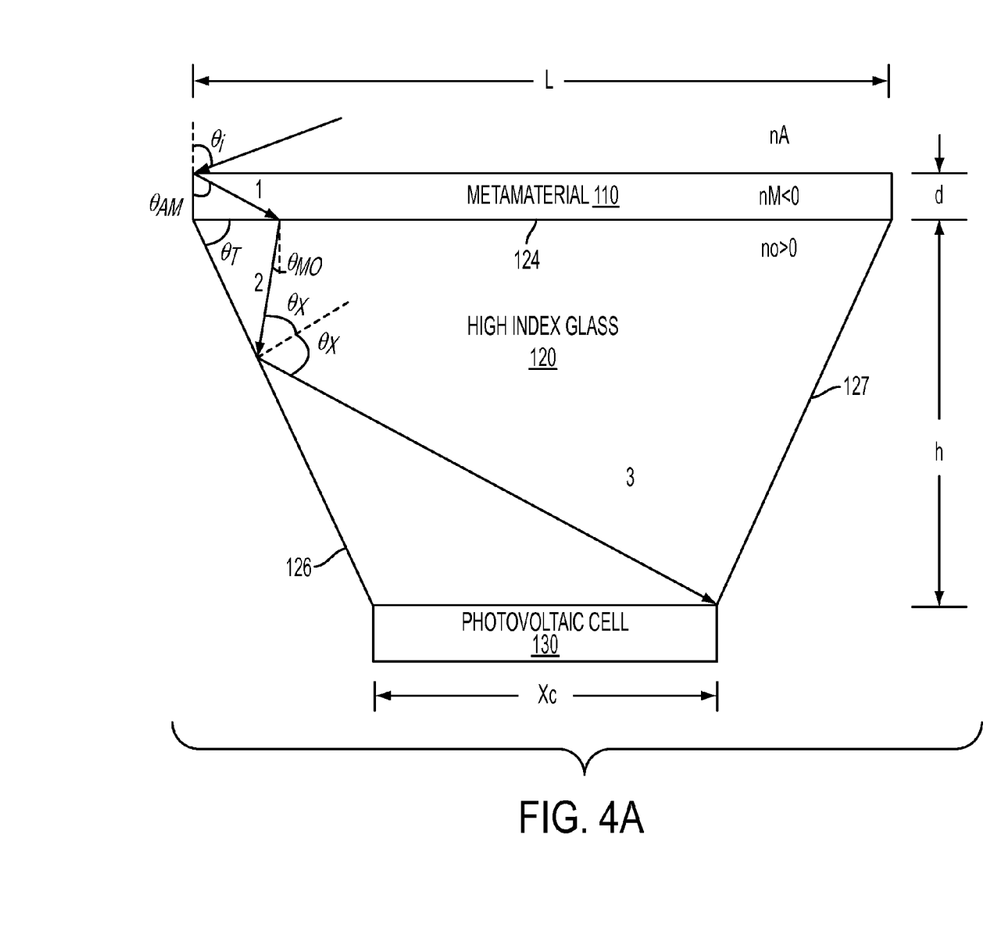
Figure 4B:
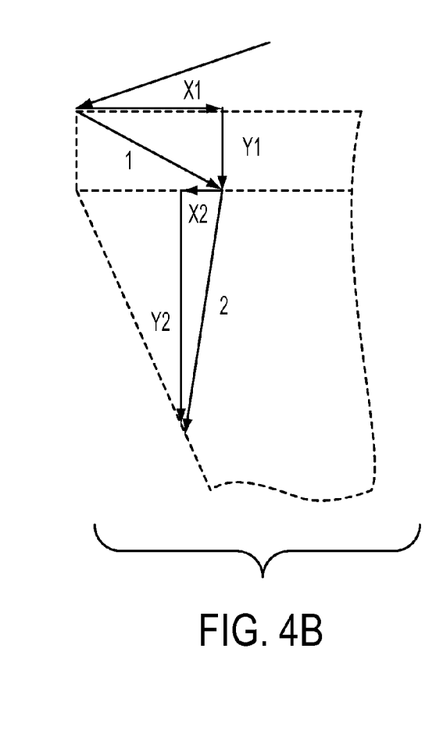
FIG. 4B is an expanded view of a portion of the FIG. 4A metamaterial and optical waveguide.

The minimum tilt angle can be found by writing the parametric equations for rays 1 and 2 with the boundary condition that ray 3 reaches the farthest opposite corner of the module where the opposite side face of the waveguide meets the top of the photovoltaic cell meet, as seen in FIGS. 4A and 4B. The tilt angle is found using parametric equations that represent the final ray 3 and side of the waveguide as follows:

$$x_1 = d\cot\theta_{MO}; \quad y_1 = -d;$$

$$x_2 = \frac{x_1 \cos\theta_T}{\tan\theta_{MO}\sin\theta_T + \cos\theta_T}; \quad y_2 = \frac{x_1 \sin\theta_T}{\tan\theta_{MO}\sin\theta_T + \cos\theta_T};$$

$$x = \frac{L - x_2 - (y_2 + d)\cot(2\theta_X + \theta_{MO} - 90°)\cos(\theta_T)}{\cot(2\theta_X + \theta_{MO} - 90°)\sin(\theta_T) + \cos(\theta_T)}; \quad \text{and}$$

$$\theta_T \geq \tan^{-1}(h/x).$$

The terms $x_1$ and $y_1$ horizontal dimension and vertical dimensions of ray 1 in the metamaterial layer, as seen in FIG. 4B. Similarly, $x_2$ and $y_2$ refer to the horizontal and vertical dimensions of ray 2 as it travels from the upper surface of the optical waveguide 120 toward the first trapezoidal side face of the optical waveguide.

The term x is the maximum length difference between the length $x_C$ of the photovoltaic cell 130 and the length L of the upper surface of the optical waveguide 120 that will ensure maximum incident radiation reaches the photovoltaic cell 130. The value of x determines the minimum tilt angle for a particular waveguide height and photovoltaic cell size.

Thus, to ensure the maximum incident radiation reaches the photovoltaic cell, the angle of tilt $\theta_T$ of the optical waveguide should satisfy both $\theta_T \geq \tan^{-1}(h/x)$ and $\theta_T > \sin^{-1}(n_A/n_O)$.

Figure 5:
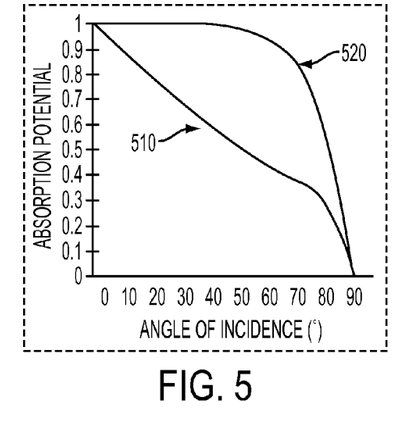
FIG. 5 is a graph comparing the potential solar energy collection for a metamaterial integrated solar collector to the potential solar energy collection for a solar collector with a Fresnel lens.

As an example, for a metamaterial integrated solar collector having a metamaterial with a 50 degree acceptance cone and an index of refraction between about −1 and about −2, and an optical waveguide formed of SF-11 glass with an index of refraction of approximately 1.7, the minimum tilt angle is approximately 70 degrees. FIG. 5 shows the predicted improvement in absorption at the photovoltaic cell in the metamaterial integrated solar collector configuration compared to an identically sized photovoltaic cell in a flat fixed orientation. The curve 510 is the predicted absorption potential for a photovoltaic cell in a flat fixed orientation plotted over a wide range of incidence angles. The curve 520 is the predicted absorption potential curve for the same photovoltaic cell when included in a metamaterial integrated solar collector in a flat fixed orientation. Note that the absorption drops off rapidly for the photovoltaic cell at angles greater than about 20 degrees, while the system with the metamaterial layer and the optical waveguide has greater absorption for a broad range of incidence angles.

Figure 6A:
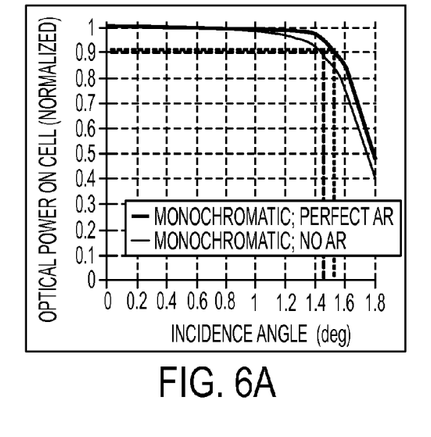
FIG. 6A illustrates the normalized optical power reaching the photovoltaic cell for an example Fresnel lens solar collector at different incidence angles.
Figure 6B:
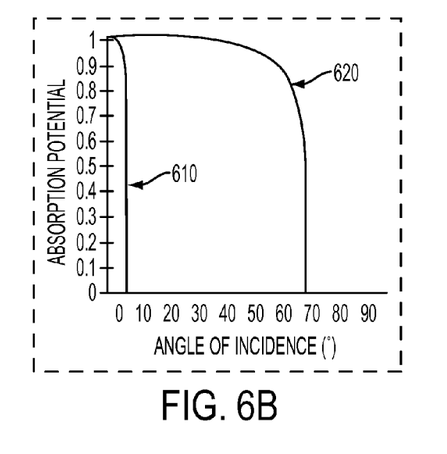
FIG. 6B compares the predicted performance of the metamaterial integrated solar collector to a Fresnel lens solar concentrator.

FIG. 6A illustrates the normalized optical power reaching the photovoltaic cell for an example Fresnel lens solar collector at different incidence angles. FIG. 6B compares the predicted performance of the metamaterial integrated solar collector to a Fresnel lens solar concentrator. The absorption potential curve 610 for the Fresnel lens system has a very narrow acceptance angle, with a steep drop-off in absorption potential at incidence angles greater than about two degrees. In comparison, the metamaterial integrated solar collector curve 620 shows much greater absorption potential at a wide range of acceptance angles.

For the metamaterial integrated solar collector system, the large acceptance cone of the metamaterial layer allows solar energy (photon flux) over a broad range of incidence angles to enter the metamaterial. As a result, if the optical waveguide's trapezoidal shape doubles the area of the metamaterial, there is a greater than two-fold increase in photon flux received.

In addition, larger waveguide tilt angles will allow radiation at the wider range of incident angles $\theta_i$ to be reflected by the side face. However, larger tilt angles also result in a more vertical side face and a smaller metamaterial surface area for receiving the solar energy, causing a reduction in radiation reaching the photovoltaic cell compared to a device with a larger surface area. To optimize absorption, a suitable range of tilt angles and waveguide heights can be determined for each specific application, depending on the index of refraction of the metamaterial and optical waveguide and on the expected incidence angles.

The system described herein can provide several benefits. A stationary metamaterial integrated solar collection system as described herein is expected to absorb more light irradiance over a day compared to a stationary concentrated photovoltaic system with a Fresnel lens. Incorporating the metamaterial-based system described herein also provides better solar collection in early morning and late afternoon hours, and makes the system less reliant on alignment to the sun. The system also has an increased ability to collect diffuse light, further increasing the system's total energy conversion.

The system can have other advantages over current concentrating photovoltaic systems. The system described herein is expected to have a lower concentration of optical energy in the optics, and is therefore less likely to need additional cooling. In addition, concentrating solar collectors using lenses often have a small acceptance cone. The wide acceptance cone of the presently described system reduces the need for steering mechanisms to follow the sun throughout the day, simplifying the design and lowering the cost for photovoltaic solar collectors.

Note that the bottom of the trapezoidal waveguide is matched to the four sides of a rectangular photovoltaic cell. The waveguide is not limited to a square profile and can have other shapes, including but not limited to, triangular, rectangular, pentagonal, hexagonal, or circular. However, waveguides with side faces that are not matched to the sides of the photovoltaic cell can reduce the power generation efficiency. In addition, although the photovoltaic cell described in the example above has a square shape, metamaterial integrated solar collectors are also envisioned that incorporate photovoltaic cells of different shapes. It is also envisioned that a single waveguide optic and metamaterial layer can be arranged over an array of photovoltaic cells, with the trapezoidal side faces of the waveguide matched to the sides of the array. An array of trapezoidal optical waveguides can also be positioned to direct light into an array of photovoltaic cells, with a single metamaterial layer arranged at the receiving surfaces of the optical waveguides.

The metamaterial and trapezoidal optical waveguide can also be used to transmit light to electro-optical or optical elements other than photovoltaic cells. Other optical elements include, but are not limited to lenses, modulators, amplifiers, and splitters. For example, the optical waveguide can be configured to concentrate light to a single point. The metamaterial can be configured, in conjunction with other optics, to transmit light parallel to the lens' axis to avoid aberrations such as comas.

A metamaterial integrated solar collector can also be configured with a metamaterial layer positioned over a Fresnel lens, to open the acceptance cone of the Fresnel lens.

Obviously, many modifications and variations of the present invention are possible in light of the above teachings. It is therefore to be understood that the claimed invention may be practiced otherwise than as specifically described.

What is claimed as new and desired to be protected by Letters Patent of the United States is:

1. An optical device comprising:
   a metamaterial layer having a negative index of refraction for at least one wavelength in the visible range of 400-700 nm, the metamaterial layer having an exposed face to incident light;
   a photovoltaic cell; and
   an optical waveguide having a trapezoidal cross section arranged between the metamaterial layer and the photovoltaic cell, the optical waveguide having a first face and second face opposite the first face, the first face having a larger area than the second face, the metamaterial layer positioned at and in direct contact with the first face of the optical waveguide and the photovoltaic cell positioned at the second face of the optical waveguide.

2. The optical device according to claim 1, wherein the optical waveguide has a plurality of planar sides, each of the planar sides having a trapezoidal shape.

3. The optical device according to claim 2, wherein the optical waveguide has exactly four planar trapezoidal sides.

4. The optical device according to claim 1, wherein the metamaterial layer has a negative index of refraction for all wavelengths of incident radiation between 400 nm and 700 nm.

5. The optical device according to claim 1, wherein each of the side faces has a tilt angle $\theta_T$ defined by $\theta_T > \theta_C - \theta_{MO}$, wherein $\theta_C$ is the critical angle of the optical waveguide with a surrounding external medium and $\theta_{MO}$ is an angle of refraction between the metamaterial layer and the optical waveguide.

6. The optical device according to claim 1, wherein each of the side faces has a tilt angle $\theta_T$ that is less than 90 degrees and greater than $\sin^{-1}(n_A/n_O)$, wherein $n_A$ is the index of refraction of a surrounding environment and $n_O$ is the index of refraction of the optical waveguide.

7. The optical device according to claim 1, wherein the metamaterial layer includes an array of coaxial waveguides having a metal core surrounded by a dielectric cylinder and clad with a metal outer layer.

8. The optical device according to claim 7, wherein the metal core and the metal outer layers are silver and the dielectric cylinder is silicon or gallium phosphide.

9. The optical device according to claim 1, wherein the optical waveguide has an angle of tilt $\theta_T$ less than 90 degrees and greater than the inverse tangent of h/x, wherein h is the height of the optical waveguide and x is found by solving parametric ray equations within the metamaterial layer and the optical waveguide with a boundary condition that all radiation transmitted from the metamaterial layer to a side face of the optical waveguide is reflected toward the second face of the optical waveguide, said parametric ray equations given by:

$$x = \frac{L - x_2 - (y_2 + d)\cot(2\theta_X + \theta_{MO} - 90°)\cos(\theta_T)}{\cot(2\theta_X + \theta_{MO} - 90°)\sin(\theta_T) + \cos(\theta_T)},$$

$$x_1 = d\cot\theta_{MO}; \; y_1 = -d,$$

$$x_2 = \frac{x_1 \cos\theta_T}{\tan\theta_{MO}\sin\theta_T + \cos\theta_T}, \; \text{and}$$

$$y_2 = \frac{x_1 \sin\theta_T}{\tan\theta_{MO}\sin\theta_T + \cos\theta_T};$$

wherein x is a maximum length difference between the length $x_C$ of the photovoltaic cell and the length L of the upper surface of the optical waveguide, d is the thickness of the metamaterial, $\theta_C$ is the critical angle of the optical waveguide with a surrounding external medium, $\theta_{MO}$ is an angle of refraction between the metamaterial layer and the optical waveguide, $\theta_X$ is an angle of reflection that the rays in the optical waveguide make with a line normal to the side face of the waveguide, $n_A$ is the index of refraction of a surrounding environment, and $n_O$ is the index of refraction of the optical waveguide.

10. An optical device comprising:
a metamaterial layer having a negative index of refraction, the metamaterial layer having an exposed face to incident light;
a photovoltaic cell; and
an optical waveguide having a trapezoidal cross section, a first face and second face arranged opposite the first face, the optical waveguide having four trapezoidal side faces joining the first face and the second face, the first face having a larger area than the second face, the optical waveguide arranged between the metamaterial layer and the photovoltaic cell with the metamaterial layer positioned at and in direct contact with the first face of the optical waveguide and the photovoltaic cell positioned at the second face of the optical waveguide,
wherein the optical waveguide has a tilt angle $\theta_T$ of less than 90 degrees, and greater than $\sin^{-1}(n_A/n_O) - \sin^{-1}(n_A \sin\theta_i/n_O)$, for all angles of incidence $\theta_i$ within the acceptance cone of the metamaterial, wherein $\theta_C$ is the critical angle of the optical waveguide with a surrounding external medium and $\theta_{MO}$ is an angle of refraction between the metamaterial layer and the optical waveguide, $n_A$ is the index of refraction of an external environment, surrounding environment, $n_O$ is the index of refraction of the optical waveguide, and $\theta_i$ is the angle of incidence of incident radiation on the metamaterial layer.

* * * * *